US010804894B1

(12) United States Patent
Todaka

(10) Patent No.: US 10,804,894 B1
(45) Date of Patent: Oct. 13, 2020

(54) SEMICONDUCTOR DEVICE

(71) Applicants:Kabushiki Kaisha Toshiba, Minato-ku, Tokyo (JP); Toshiba Electronic Devices & Storage Corporation, Minato-ku, Tokyo (JP)

(72) Inventor: Junichi Todaka, Nakatsu Oita (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/786,256

(22) Filed: Feb. 10, 2020

(30) Foreign Application Priority Data

Aug. 29, 2019 (JP) .................................. 2019-157174

(51) Int. Cl.
*H03K 17/22* (2006.01)
*G06F 1/24* (2006.01)
*G06F 1/30* (2006.01)
*H03K 17/687* (2006.01)
*H03K 19/0944* (2006.01)
*G05F 3/26* (2006.01)
*H03K 19/003* (2006.01)

(52) U.S. Cl.
CPC ............. *H03K 17/223* (2013.01); *G05F 3/26* (2013.01); *G06F 1/24* (2013.01); *G06F 1/305* (2013.01); *H03K 17/687* (2013.01); *H03K 19/00315* (2013.01); *H03K 19/0944* (2013.01)

(58) Field of Classification Search
None
See application file for complete search history.

(56) References Cited

U.S. PATENT DOCUMENTS

| 7,307,462 | B2 * | 12/2007 | Cheng ................... H02M 1/096 |
| | | | 327/108 |
| 8,405,429 | B2 | 3/2013 | Numano |
| 9,929,652 | B1 * | 3/2018 | Ribarich ................. H02M 1/08 |
| 10,224,817 | B1 * | 3/2019 | Sharma ................. H03K 17/165 |
| 2007/0268059 | A1 | 11/2007 | Sakaguchi et al. |
| 2012/0176167 | A1 * | 7/2012 | Lee ........................... G06F 1/24 |
| | | | 327/143 |
| 2018/0331682 | A1 * | 11/2018 | Duduman ............ H03K 17/063 |

FOREIGN PATENT DOCUMENTS

| JP | 2007-311971 A | 11/2007 |
| JP | 2010-219947 A | 9/2010 |
| JP | 5433510 B2 | 3/2014 |

* cited by examiner

*Primary Examiner* — Lincoln D Donovan
*Assistant Examiner* — Khareem E Almo
(74) *Attorney, Agent, or Firm* — White & Case LLP

(57) ABSTRACT

According to one embodiment, a semiconductor device includes an output reset circuit. The output reset circuit including: a first circuit configured to monitor a power-supply voltage and generate a reset signal; a logic circuit configured to control a logic level of an output signal in accordance with the reset signal; a second circuit configured to generate a current in accordance with the power-supply voltage and the reset signal; a third circuit configured to generate a control signal in accordance with the current and the reset signal; and a fourth circuit configured to control the output signal in accordance with the control signal.

18 Claims, 4 Drawing Sheets

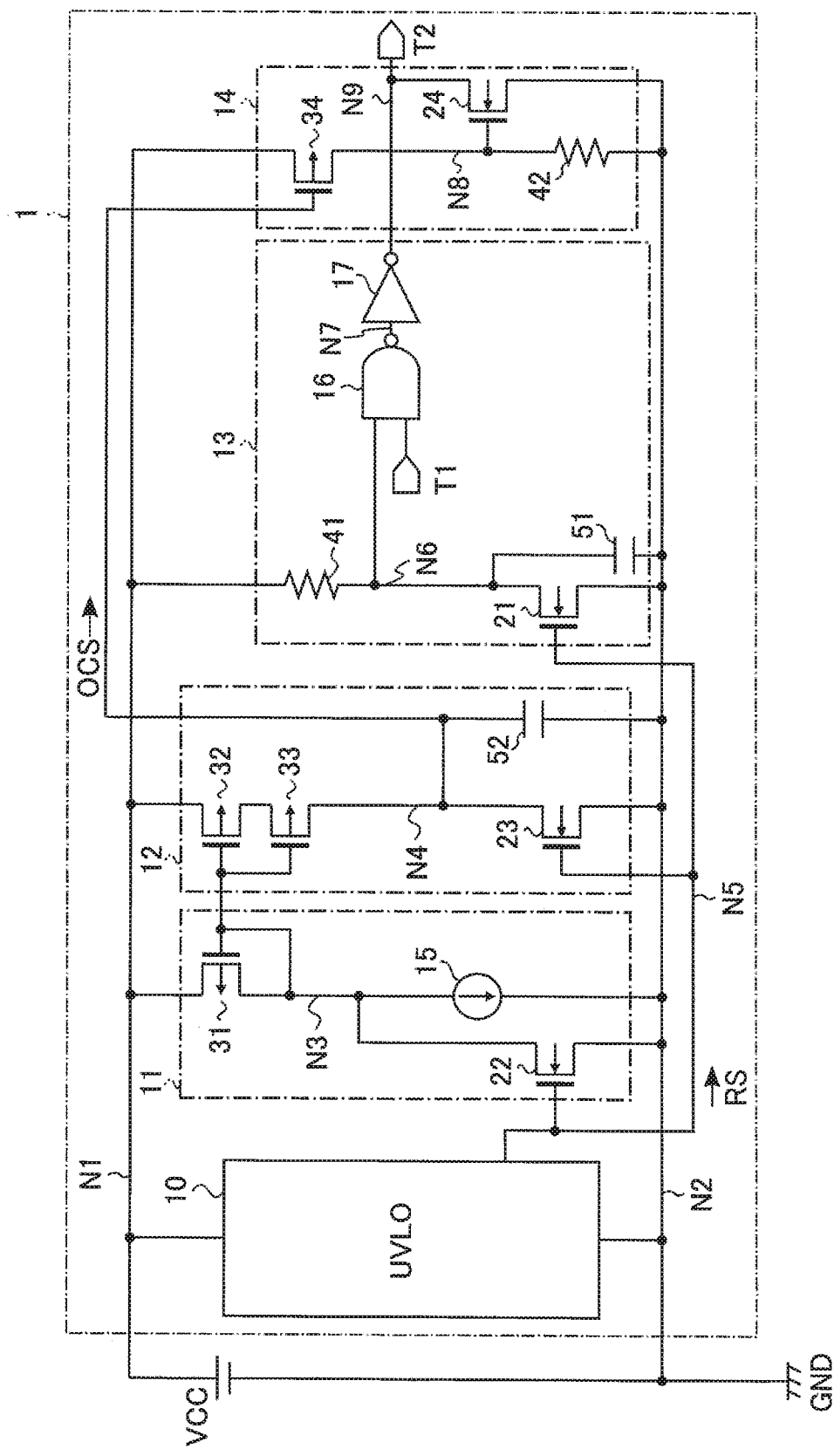
F I G. 1

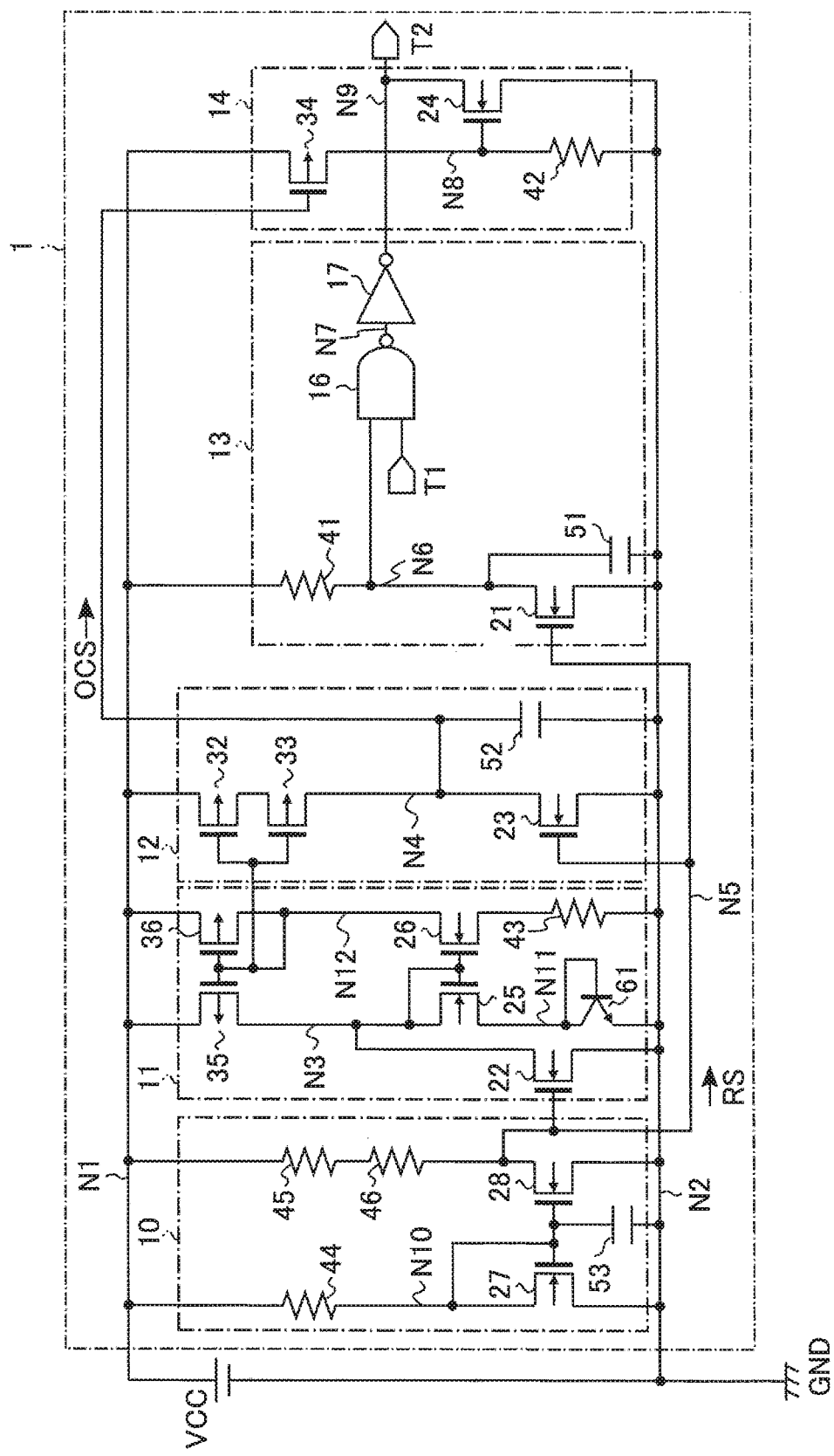
F I G. 4

SEMICONDUCTOR DEVICE

CROSS-REFERENCE TO RELATED APPLICATIONS

This application is based upon and claims the benefit of priority from Japanese Patent Application No. 2019-157174, filed Aug. 29, 2019, the entire contents of which are incorporated herein by reference.

FIELD

Embodiments described herein relate generally to a semiconductor device.

BACKGROUND

A semiconductor device having an output reset circuit that resets an output when a power is turned on is known.

BRIEF DESCRIPTION OF THE DRAWINGS

FIG. 1 is a circuit diagram of an output reset circuit of a semiconductor device according to a first embodiment.

FIG. 4 is a circuit diagram of an output reset circuit of a semiconductor device according to a second embodiment.

DETAILED DESCRIPTION

Figure 2:
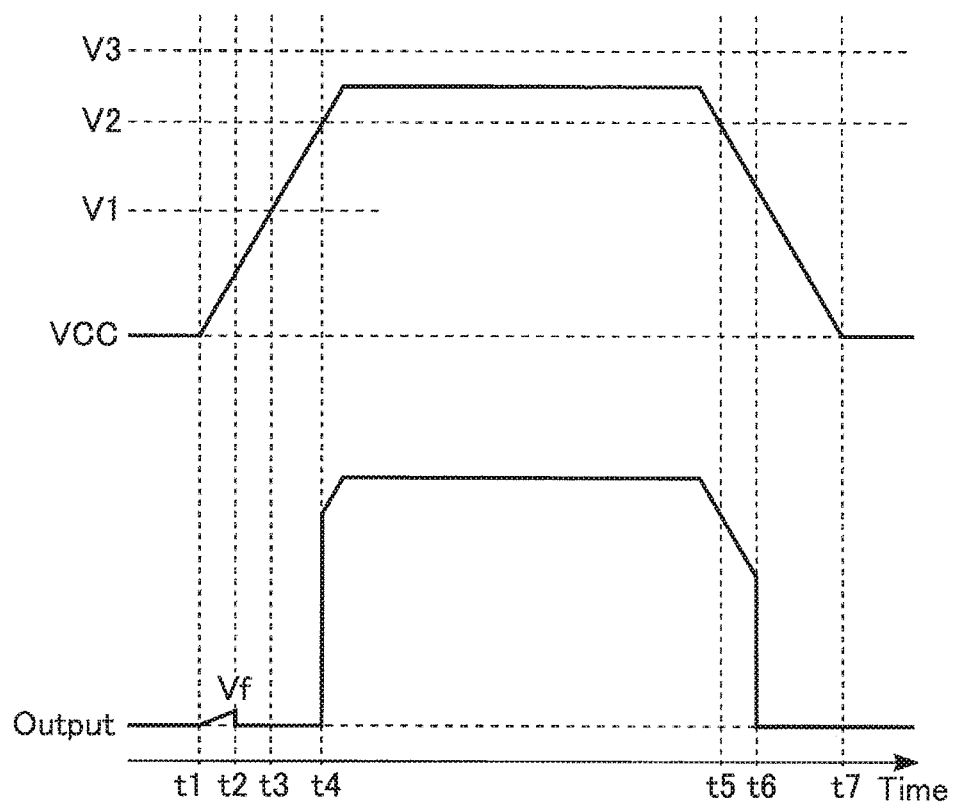
FIG. 2 is a drawing showing a power-supply voltage and a voltage of an output signal in the semiconductor device according to the first embodiment.

In general, according to one embodiment, a semiconductor device includes: an output reset circuit including: a first circuit configured to monitor a power-supply voltage and generate a reset signal; a logic circuit configured to control a logic level of an output signal in accordance with the reset signal; a second circuit configured to generate a current in accordance with the power-supply voltage and the reset signal; a third circuit configured to generate a control signal in accordance with the current and the reset signal; and a fourth circuit configured to control the output signal in accordance with the control signal.

Hereinafter, embodiments will be described with reference to the accompanying drawings. In the descriptions below, constituent elements having the same functions and configurations will be denoted by the same reference symbols, and repetitive descriptions will be avoided. All of the descriptions of an embodiment are applicable as descriptions of another embodiment, unless explicitly or self-evidently excluded.

The function blocks do not have to be categorized as in the example described below. For example, some of the functions may be implemented by a function block other than the exemplary function blocks. In addition, the exemplary function blocks may be further divided into function sub-blocks. An embodiment is not limited by a function block that specifies the embodiment.

Within the range of the specification and the claims, a situation where a first element is "coupled to" a second element includes a situation where a first element is coupled to a second element directly or via an element that is constantly or selectively conductive.

1. First Embodiment

A semiconductor device according to a first embodiment will be described.

1.1 Configuration of Semiconductor Device

First, an example of the configuration of the semiconductor device according to the present embodiment will be described, using an output reset circuit as an example. FIG. 1 is a circuit diagram of the output reset circuit. In the following descriptions, "one end of the transistor" refers to either one of the source or the drain of the transistor, and "the other end of the transistor" refers to the other, unless specified.

As shown in FIG. 1, the output reset circuit 1 includes a UVLO (undervoltage-lockout) circuit 10, a bias current generator 11, an output control signal generator 12, an I/O logic circuit 13, an output controller 14, and terminals T1 and T2.

Terminal T1 functions as an input terminal of the output reset circuit 1. Terminal T2 functions as an output terminal of the output reset circuit 1. Terminals T1 and T2 are coupled to a circuit (not shown) in the semiconductor device, or an external device.

The UVLO circuit 10 monitors a power-supply voltage VCC supplied to the semiconductor device, and outputs a reset signal RS to node N5 based on a voltage value of the power-supply voltage VCC. Specifically, the UVLO circuit 10 sets the reset signal RS at a high ("H") level if the power-supply voltage VCC is below a predetermined detection voltage. On the other hand, the UVLO circuit 10 sets the reset signal RS at a low ("L") level if the power-supply voltage VCC is higher than the detection voltage. As the detection voltage, a lower limit value of a voltage that guarantees operation of the semiconductor device is set, for example. The voltage value of the "H"-level reset signal RS may be the power-supply voltage VCC. The voltage value of the "L"-level reset signal RS may be the ground voltage GND.

The UVLO circuit 10 includes an input terminal, a reset signal output terminal, and a GND terminal. The input terminal is coupled to node N1. The power-supply voltage VCC is applied to node N1. In other words, node N1 may be regarded as a power-supply voltage interconnect. The reset signal output terminal is coupled to node N5, and outputs a reset signal RS. The GND terminal is coupled to node N2. The ground voltage GND is applied to node N2. In other words, node N2 may be regarded as a ground voltage interconnect.

The bias current generator 11 generates a bias current to be supplied to the output control signal generator 12 based on the reset signal RS. The bias current generator 11 includes a transistor 22 which is an n-type MOSFET (metal oxide semiconductor field effect transistor) (hereinafter, described as "NMOS transistor"), a transistor 31 which is a p-type MOSFET (hereinafter, described as "PMOS transistor"), and a current source 15.

One end of the NMOS transistor 22 is coupled to node N3, the other end is coupled to node N2, and a gate of the NMOS transistor 22 is coupled to node N5. One end of the PMOS transistor 31 is coupled to node N1, and the other end and a gate of the transistor 31 are coupled to node N3. An input terminal of the current source 15 is coupled to node N3, and an output terminal of the current source 15 is coupled to node N2.

The output control signal generator 12 generates an output control signal OCS and transmits it to the output controller 14 based on the reset signal RS and a bias current. The output control signal generator 12 includes an NMOS transistor 23, PMOS transistors 32 and 33, and a capacitor element 52.

One end of the NMOS transistor 23 is coupled to node N4, the other end is coupled to node N2, and a gate of the NMOS transistor 23 is coupled to node N5. One end of the PMOS transistor 32 is coupled to node N1, the other end is coupled to one end of the PMOS transistor 33, and a gate of the PMOS transistor 32 is coupled to node N3. The other terminal of the PMOS transistor 33 is coupled to node N4, and a gate of the PMOS transistor 33 is coupled to node N3. One of the electrodes of the capacitor element 52 is coupled to node N4, and the other electrode is coupled to node N2. For example, if the PMOS transistors 32 and 33 are in an on state, the "on" resistances of the PMOS transistors 32 and 33 and the capacitor element 52 constitute an RC delay circuit in node N4.

The I/O logic circuit 13 is a logic circuit that transmits, to terminal T2, an input signal received from terminal T1 based on the reset signal RS received from the UVLO circuit 10. If the reset signal RS is at the "H" level, the I/O logic circuit 13 sets the output to a "disable" state (hereinafter, may be referred to as "reset state"). In this case, the "L" level output signal is transmitted to terminal T2, regardless of a signal input to terminal T1. If the reset signal RS is at the "L" level, the I/O logic circuit 13 sets the output to an "enable" state (hereinafter also referred to as "reset canceled state"). In this case, the input signal input to terminal T1 is transmitted to terminal T2 as the output signal.

The I/O logic circuit 13 includes a NAND circuit 16, an inverter circuit 17, an NMOS transistor 21, a resistor element 41, and a capacitor element 51.

One end of the NMOS transistor 21 is coupled to node N6, the other end is coupled to node N2, and a gate of the NMOS transistor 21 is coupled to node N5. One end of the resistor element 41 is coupled to node N1, and the other end is coupled to node N6. The capacitor element 51 is a decoupling capacitor. The capacitor element 51 has, for example, a function to absorb and stabilize a noise component, etc. that cause voltage fluctuations in node N6. One of the electrodes of the capacitor element 51 is coupled to node N6, and the other electrode is coupled to node N2. The NAND circuit 16 has two input terminals. One of the input terminals of the NAND circuit 16 is coupled to node N6, and the other is coupled to terminal T1. An output terminal of the NAND circuit 16 is coupled to an input terminal of the inverter circuit 17 via node N7. An output terminal of the inverter circuit 17 is coupled to terminal T2 via node N9.

The output controller 14 resets the output signal based on the output control signal OCS received from the output control signal generator 12, and suppresses voltage floating of the output signal.

Specifically, upon receipt of the "H" level reset signal RS, the I/O logic circuit 13 controls the logic so that the output signal is at the "L" level. However, if the voltage value of the power-supply voltage VCC is low, there is a range wherein the I/O logic circuit 13 becomes indeterminate and the logic thereof cannot be determined. In this case, the output of the I/O logic circuit 13 will be in a high-impedance state, and under a condition where the power-supply voltage VCC rapidly rises, the voltage of the output signal may float due to a coupling of a parasitic capacitance appearing in terminal T2 (output terminal). Under a condition where the logic of the I/O logic circuit 13 cannot be determined, the output controller 14 resets an output signal so as to shorten the period of time during which the output signal voltage floats.

The output control signal generator 14 includes an NMOS transistor 24, a PMOS transistor 34, and a resistor element 42.

One end of the NMOS transistor 24 is coupled to node N9, the other end is coupled to node N2, and a gate of the NMOS transistor 24 is coupled to node N8. One end of the PMOS transistor 34 is coupled to node N1, the other end is coupled to node N8, and a gate of the PMOS transistor 34 is coupled to node N4. One end of the resistor element 42 is coupled to node N8, and the other end is coupled to node N2.

1.2 Operation of Output Reset Circuit

Next, the operation of the output reset circuit 1 will be described. Hereinafter, three states according to the voltage value of the power-supply voltage VCC will be described. The voltage value of the power-supply VCC in a first state is higher than the ground voltage GND and lower than a voltage value determined by the logic of the I/O logic circuit 13. The voltage value of the power-supply VCC in a second state is equal to or higher than the voltage determined by the logic of the I/O logic circuit 13 and lower than a detection voltage of the UVLO circuit 10. The voltage value of the power-supply voltage VCC in a third state is within the range of voltage that guarantees the operation of the semiconductor device. For example, suppose the lower limit of the voltage value required to determine the logic of the I/O logic circuit 13 is voltage V1, the detection voltage in the UVLO circuit 10 is V2, and the upper limit voltage value that guarantees the operation of the semiconductor device is V3. If so, the power-supply voltage VCC in the first state will be in the relationship GND<VCC<V1. The power-supply voltage VCC in the second state will be in the relationship V1≤VCC<V2. The power-supply voltage VCC in the third state will be in the relationship V2≤VCC<V3.

1.2.1 First State

First, the first state will be described with reference to FIG. 1.

For example, at the initial time when the supply of the power-supply voltage VCC starts (hereinafter, this time may be referred to as "power supply turned-on time"), in a state where the power-supply voltage VCC is lower than the voltage V1, it is difficult to determine the logic of the transistors in the semiconductor device. In this case, the reset signal RS is set to a high-impedance state, for example. In the bias current generator 11, a high-impedance signal (a voltage that follows the power-supply voltage VCC from the "L" level due to a coupling) is applied to node N3. Thus, in the output control signal generator 12, the gates of the PMOS transistors 32 and 33 mirror-coupled to the PMOS transistor 31 are biased. The voltage value of the power-supply voltage VCC (node N1) increases as time elapses, but the voltage of node N4 (output control signal OCS) is maintained at an "L" level for a certain period of time by the RC delay circuit comprised of the "on" resistances of the PMOS transistors 32 and 33 and the capacitor element 52. While the output control signal OCS is maintained at the "L" level, the PMOS transistor 34 of the output controller 14 is set to the on state. Node N1 and node N8 are thereby electrically coupled to each other. Then, the voltage of node N8 increases as the power-supply voltage VCC (node N1) increases, and the NMOS transistor 24 is set to the on state. Node N9 and node N2 are thereby electrically coupled to each other, and the output signal in node N9 is reset. Thus, a period of time during which the output signal voltage floats is shortened, and the floating voltage of the output signal is suppressed. In other words, in the first state, the output signal is set to a reset state by the output controller 14.

1.2.2 Second State

Next, the second state will be described.

When the power-supply voltage VCC increases to voltage V2 or higher, the UVLO circuit 10 determines the logic of the reset signal RS and sets the signal to the "H" level. The NMOS transistor 22 of the bias current generator 11 is set to the on state by the "H" level reset signal RS. Upon electrical coupling between node N3 and node N2 via the NMOS transistor 22, the "L" level voltage is applied to node N3. In the output control signal generator 12, the "L" level signal is applied to the gates of the PMOS transistors 32 and 33, and the PMOS transistors 32 and 33 are set to the on state. Node N1 and node N4 are electrically coupled to each other, and the "H" level voltage is applied to node N4 (the output control signal OCS is set to the "H" level). By the "H" level output control signal OCS, the PMOS transistor 34 of the output controller 14 is set to an off state and node N8 is set to the "L" level. The NMOS transistor 24 is set to the off state. The reset state of the output signal set by the output controller 14 is thus canceled.

Meanwhile, the NMOS transistor 21 is set to the on state in the I/O logic circuit 13. Node N6 and node N2 are electrically coupled to each other, and the "L" level signal is input to one of the input terminals of the NAND circuit 16. Thus, the NAND circuit 16 outputs the "H" level signal, regardless of the input signal received from terminal T1. As a result, the inverter circuit 17 transmits the "L" level signal to terminal T2. In other words, the I/O logic circuit 13 is turned to a "disable" state, and sets the output signal to a "reset" state ("L" level state"). In other words, in the second state, the output signal is reset by the I/O logic circuit 13.

1.2.3 Third State

Next, the third state will be described.

When the power-supply voltage VCC reaches the detection voltage (voltage V2) or higher (a normal use state), the UVLO circuit 10 sets the reset signal RS to the "L" level. The NMOS transistor 22 of the bias current generator 11 is set to the off state by the "L" level reset signal RS. Node N3 is maintained at a constant voltage by the current source 15. Thus, in the output control signal generator 12, the constant voltage is applied to the gates of the PMOS transistors 32 and 33, and the PMOS transistors 32 and 33 are set to the on state. The NMOS transistor 23 is set to the "L" level in accordance with the "L" level reset signal RS. As a result, node N4 (the output control signal OCS) is set to the "H" level. In the output controller 14, the PMOS transistor 34 and the NMOS transistor 24 are set to the off state. In other words, the reset state of the output signal that has been set by the output controller 14 is canceled.

The I/O logic circuit 13 is set to the enable state. Specifically, in the I/O logic circuit 13, the NMOS transistor 21 is set to the off state. Thus, node N6 is set to the "H" level, and the "H" level signal is input into one of the input terminals of the NAND circuit 16. For this reason, the NAND circuit 16 outputs an inversion signal of the input signal received from terminal T1, and the inverter circuit 17 transmits an inversion signal of the inversion signal (namely, the input signal) to terminal T2. As a result, the output reset circuit 1 outputs a signal in accordance with the input signal.

1.3 Voltages of Interconnects

Next, an example of voltages of interconnects will be described. Hereinafter, for the sake of brevity, a case where the input signal is at the "H" level is described.

1.3.1 Relationship Between Power-Supply Voltage VCC and Output Signal of Output Reset Circuit First, the relationship between the power-supply voltage VCC and the output signal of the output reset circuit 1 will be described with reference to FIG. 2.

As shown in FIG. 2, at time t1, the supply of the power-supply voltage VCC to the semiconductor device is started, and the semiconductor device starts a power supply activation operation.

During the period from time t1 through time t3, the power-supply voltage VCC is in the relationship GND≤VCC<V1, and the output reset circuit 1 is set to the first state.

Specifically, during the period from time t1 through time t2, although the output controller 14 receives the "L" level output control signal OCS, the NMOS transistor 24 is in the off state since the power-supply voltage VCC is in a low state. For this reason, the output controller 14 does not reset the output signal. As a result, if the floating voltage of the output signal is Vf, the voltage Vf also increases along with an increase in the power-supply voltage VCC.

At time t2, the NMOS transistor 24 of the output controller 14 is turned to the on state. Thus, the output controller 14 sets the output signal to the reset state ("L" level state). Thus, voltage floating of the output signal can be suppressed.

During the period from time t2 to time t3, the output controller 14 maintains the reset state of the output signal, and thereby suppresses voltage floating of the output signal.

During the period from time t3 through time t4, the power-supply voltage VCC is in the relationship V1≤VCC<V2, and the output reset circuit 1 is set to the second state.

Specifically, at time t3, when the power-supply voltage VCC becomes greater than voltage V1, the output reset circuit 1 transitions to the second state. The output controller 14 cancels the reset state. The I/O logic circuit 13 is turned to the "disable" state, and outputs the "L" level signal.

During the period from time t4 through time t5, the power-supply voltage VCC is in the relationship V2≤VCC<V3, and the output reset circuit 1 is set to the third state.

Specifically, at time t4, when the power-supply voltage VCC becomes higher than voltage V2 (detection voltage), the output reset circuit 1 transitions to the third state. The reset signal RS is set to the "L" level, and the I/O logic circuit 13 is set to the "enable" state. In other words, the semiconductor device finishes the power supply activation operation, and transitions to a regular operation state. For example, if the input signal in the output reset circuit 1 is at the "H" level, the output signal is set to the "H" level.

At time t5, if the power-supply voltage VCC becomes lower than voltage V2, the semiconductor device starts a power supply deactivation operation. In the output reset circuit 1, the reset signal RS is set to the "L" level. However, due to an internal delay in the output reset circuit 1, the output signal is set to the "L" level at time t6.

At time t7, the power-supply voltage VCC decreases to the ground voltage GND, and the power supply deactivation operation is finished.

1.3.2 Voltages of Interconnects in Output Reset Circuit During Power Supply Activation Operation Next, voltages of interconnects in the output reset circuit 1 during the power supply activation operation will be described with reference to FIG. 3.

Figure 3:
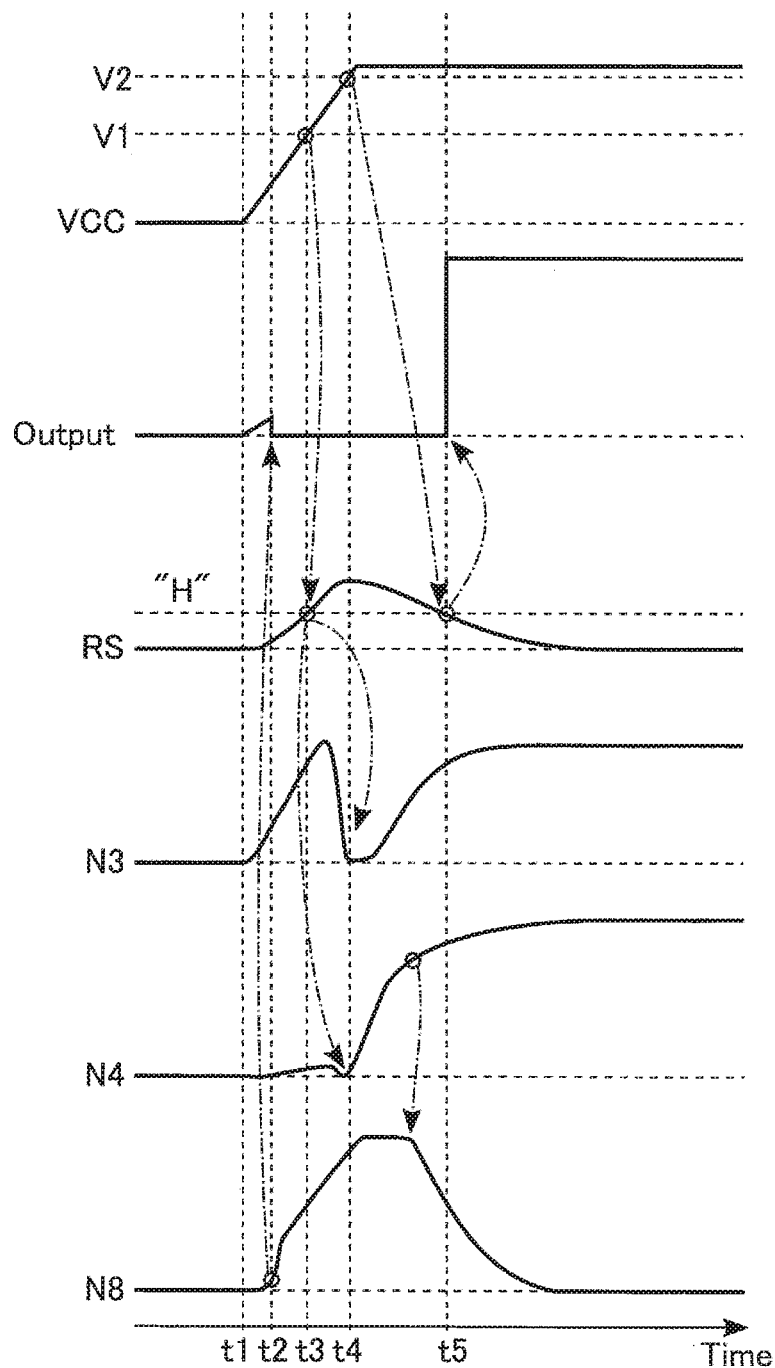
FIG. 3 is a drawing showing voltages of interconnects and a reset signal when a power supply is activated in the semiconductor device according to the first embodiment.

As shown in FIG. 3, the period from time t1 through time t3 corresponds to the first state, the period from time t3 through time t4 corresponds to the second state, and the period from time t4 and thereafter corresponds to the third state.

Specifically, the reset signal RS (node N5) is set to a high-impedance state during the period from time t1 to time t3. For this reason, the voltage of the reset signal RS increases along with an increase in the power-supply voltage VCC due to coupling. Then, at time t3, if the power-supply voltage VCC becomes equal to or higher than voltage V1, the logic level of the reset signal RS is determined, and is set to the "H" level. At time t4, if the power-supply voltage VCC becomes equal to or higher than voltage V2, the voltage of the reset signal RS decreases; however, the decrease is relatively gradual due to an internal delay of the UVLO circuit 10. For this reason, at time t5, the reset signal RS is set to the "L" level. Thus, the reset state of the output of the output reset circuit 1 is canceled at time t5. For example, if the input signal is at the "H" level, the output signal is set to the "H" level.

Node N3 is set to the high-impedance state during the period from time t1 through time t3. For this reason, the voltage of node N3 increases along with an increase in the power-supply voltage VCC due to a coupling. The reset signal RS is set to the "H" level, and when the voltage thereof reaches a level exceeding the threshold voltage of the NMOS transistor 22, the NMOS transistor 22 is set to the on state. The voltage value of node N3 thereby decreases, and is set to the "L" level. Furthermore, in the third state, the reset signal RS is set to the "L" level, and the NMOS transistor 22 is set to the off state. Then, the constant voltage is applied to node N3 through a constant current operation by the current source 15.

During the period from time t1 through time t3, node N4 is set to the "L" level by the RC delay circuit consisting of the PMOS transistors 32 and 33 and the capacitor element 52. During the period from time t3 through time t4, node N4 remains at the "L" level, as the NMOS transistor 21 is set to the on state by the "H" level reset signal RS. In the third state, after the capacitor element 52 is charged in accordance with the voltage value of node N3, the voltage value of node N4 increases. Thereafter, a constant voltage is also applied to node N4 through the constant voltage operation in node N3.

At time t2, if the voltage of node N8 becomes higher than a threshold voltage of the NMOS transistor 24, the NMOS transistor 24 is set to the on state. Thus, the output controller 14 resets the output signal, and floating of the output voltage is thereby suppressed. When the PMOS transistor 34 is turned to the off state due to the voltage increase in node N4, the NMOS transistor 24 is set to the off state. The voltage value of node N8 thereby decreases, and is set to the "L" level.

1.4 Advantageous Effects of Present Embodiment

The configuration according to the present embodiment can provide a semiconductor device that achieves a stable operation in the device even at the time of turning on the power. Hereinafter, this advantage will be described in detail.

For example, upon receipt of a reset signal from the UVLO circuit, the I/O logic circuit of the output reset circuit controls the output logic so that the output signal becomes the "L"-level signal. However, if the power-supply voltage VCC is low, there is a range wherein the logic of the I/O logic circuit cannot be determined. For this reason, under a condition where the output level is in a high-impedance state and the power-supply voltage VCC is rapidly applied, the output voltage may float due to a coupling of a parasite capacitance occurring in the output terminal in the output reset circuit. Furthermore, when an output of the output reset circuit is erroneously detected within the semiconductor device, it is anticipated that an erroneous operation in the semiconductor device (for example, failure to complete initialization of an internal register) may be caused.

As a procedure of suppressing floating in the output voltage, a capacitor may be externally provided between the output and the GND, and used. In this case, a cost and a chip area belonging to the external capacitor will increase.

In contrast, according to the configuration of the present embodiment, an output reset circuit including a UVLO circuit, an I/O logic circuit, a bias current generator, an output control signal generator, and an output controller can be configured. Furthermore, it is possible to shorten a period of time during which floating of the output voltage occurs before the output signal is reset in the I/O logic circuit, through the use of an RC delay time in the output control signal generator. Thus, voltage floating of the output signal can be suppressed. Therefore, a stable operation in the device can be achieved even at the time of turning on the power supply.

Furthermore, according to the configuration of the present embodiment, it is possible to reduce a number of externally inserted components, such as a capacitor between the output and the GND, thereby suppressing the increase in cost of the semiconductor device.

2. Second Embodiment

Next, the second embodiment will be described. In the second embodiment, an example of the UVLO circuit 10 and the bias current generator 11 will be described. Hereinafter, the points different from the first embodiment will be mainly described.

2.1 Configuration of Semiconductor Device

First, the configuration of the semiconductor device according to the present embodiment will be described with reference to FIG. 4.

As shown in FIG. 4, the UVLO circuit 10 includes the NMOS transistors 27 and 28, the resistor elements 44 through 46, and the capacitor element 53.

One end and a gate of the NMOS transistor 27 is coupled to node N10, and the other end is coupled to node N2. One end of the NMOS transistor 28 is coupled to node N5, the other end is coupled to node N2, and a gate of the NMOS transistor 28 is coupled to node N10. One of the electrodes of the capacitor element 53 is coupled to node N10, and the other is coupled to node N2. The capacitor element 53 is a decoupling capacitor. The capacitor element 53 has, for example, a stabilization function through absorbing a noise component that causes voltage fluctuations in a gate potential of the NMOS transistors 27 and 28. One end of the resistor element 44 is coupled to node N1, and the other end is coupled to node N10. One end of the resistor element 45 is coupled to node N1, and the other end is coupled to one end of the resistor element 46. The other end of the resistor element 46 is coupled to node N5.

The bias current generator 11 includes the NMOS transistors 22, 25, and 26, and the PMOS transistors 35 and 36, the resistor element 43, and an npn bipolar transistor 61.

One end of the transistor 22 is coupled to node N3, the other end is coupled to node N2, and a gate of the transistor 22 is coupled to node N5. One end and a gate of the NMOS transistor 25 are coupled to node N3, and the other end is coupled to node N11. One end of the NMOS transistor 26 is coupled to node N12, a gate of the NMOS transistor 26 is coupled to node N3, and the other end is coupled to one end of the resistor element 43. The other end of the resistor element 43 is coupled to node N2. A collector and a base of the npn bipolar transistor are coupled to node N11, and an emitter of the npn bipolar transistor is coupled to node N2. One end of the PMOS transistor 35 is coupled to node N1, a gate of the PMOS transistor 35 is coupled to node N12, and the other is coupled to node N3. One end of the PMOS transistor 36 is coupled to node N1, and the other end and a gate of the PMOS transistor 36 are coupled to node N12.

The bias current generator 11 lets a constant current flow in an electric path between the VCC and the GND (between node N1 and node N2) via the PMOS transistor 36, the NMOS transistor 26, and the resistor element 43, and a bias (constant voltage) is thereby generated in node N12. The PMOS transistor 35, the NMOS transistor 25, and the npn bipolar transistor 61 constitute a starter circuit (a circuit for biasing the gate of the NMOS transistor 26) in which the npn bipolar transistor 61 serves as a current source.

In the present embodiment, the gates of the PMOS transistors 32 and 33 in the output control signal generator 12 are coupled to node N12.

The other structures are the same as those shown in FIG. 1 of the first embodiment.

2.2 Operation of UVLO Circuit

Next, an operation of the UVLO circuit 10 is described with reference to FIG. 4.

When the power-supply voltage VCC reaches the detection voltage or higher, the NMOS transistor 27 of the UVLO circuit 10 operates in a saturation region; therefore, an approximately constant current flows from node N10 to node N2. Then, in turn, a current flows in the mirror-coupled NMOS transistor 28. With the resistor elements 44 through 46, a current ratio between the NMOS transistor 27 and the NMOS transistor 28 is adjusted, and the NMOS transistor 28 is caused to operate in a non-saturation region. The "L" level is thus output to the reset signal RS (node N5).

If the power-supply voltage VCC is lower than the detection voltage, the current flowing in the NMOS transistor 27 of the UVLO circuit 10 decreases with a decrease in the voltage of the power-supply voltage VCC. The gate-source voltage VGS of the NMOS transistor 28 thus decreases. The NMOS transistor 28 operates in a saturation region, and the "H" level is output to the reset signal RS.

2.3 Advantageous Effects of Second Embodiment

The configuration of the present embodiment achieves advantageous effects similar to those achieved by the first embodiment.

3. Modification, Etc

The semiconductor device according to the above-described embodiments includes: an output reset circuit including: a first circuit (10) configured to monitor a power-supply voltage and generate a reset signal; a logic circuit (13) configured to control a logic level of an output signal in accordance with the reset signal; a second circuit (11) configured to generate a current in accordance with the power-supply voltage and the reset signal; a third circuit (12) configured to generate a control signal in accordance with the current and the reset signal; and a fourth circuit (14) configured to control the output signal in accordance with the control signal.

By applying the above-described embodiments, a semiconductor device that achieves a stable operation in the device even at the time of turning on the power can be provided.

The embodiments are not limited to the above-described aspects, but can be modified in various ways.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
    an output reset circuit including:
        a first circuit configured to monitor a power-supply voltage and generate a reset signal;
        a logic circuit configured to control a logic level of an output signal in accordance with the reset signal;
        a second circuit configured to generate a current in accordance with the power-supply voltage and the reset signal;
        a third circuit configured to generate a control signal in accordance with the current and the reset signal; and
        a fourth circuit configured to control the output signal in accordance with the control signal.

2. The device according to claim 1, wherein the third circuit includes an RC delay circuit that delays the control signal.

3. The device according to claim 1, wherein
    the power-supply voltage includes a first state where the power-supply voltage is equal to or higher than a ground voltage and lower than a first voltage, a second state where the power-supply voltage is equal to or higher than the first voltage and lower than a second voltage, and a third state where the power-supply voltage is equal to or higher than the second voltage,
    in the first state, the control signal is set to a first logic level, and the fourth circuit resets the output signal based on the control signal,
    in the second state, the first circuit sets the reset signal to a second logic level, and the logic circuit resets the output signal based on the reset signal of the second logic level, and
    in the third state, the first circuit sets the reset signal to the first logic level, and the fourth circuit and the logic circuit do not reset the output signal.

4. The device according to claim 1, wherein
the logic circuit sets the output signal to the first logic level when the reset signal is in a second logic level, and outputs a received input signal when the reset signal is in a first logic level.

5. The device according to claim 3, wherein
the fourth circuit includes:
- a first PMOS transistor having one end coupled to a first node to which the power-supply voltage is applied, an other end coupled to a second node, and a gate to which the control signal is applied;
- a first NMOS transistor having one end coupled to a third node that transmits the output signal, an other end coupled to a fourth node to which the ground voltage is applied, and a gate coupled to the second node; and
- a first resistor element having one end coupled to the second node and an other end coupled to the fourth node, wherein, in the first stage, when the power-supply voltage increases more than a threshold voltage of the first NMOS transistor, the first NMOS transistor is set to an on state, and the output signal is reset.

6. The device according to claim 5, wherein
in the first state, the first PMOS transistor is in the on state.

7. The device according to claim 5, wherein
in the second state, the first PMOS transistor and the first NMOS transistor are set to an off state.

8. The device according to claim 5, wherein
in the third state, the first PMOS transistor and the first NMOS transistor are set to an off state.

9. The device according to claim 1, wherein
the first circuit is an undervoltage-lockout (UVLO) circuit.

10. The device according to claim 3, wherein
the second circuit includes:
- a second PMOS transistor having one end coupled to a first node to which the power-supply voltage is applied and an other end and a gate coupled to a fifth node;
- a second NMOS transistor having one end coupled to the fifth node, an other end coupled to a fourth node to which the ground voltage is applied, and a gate into which the reset signal is input; and
- a current source having an input terminal coupled to the fifth node and an output terminal coupled to the fourth node, and the third circuit includes:
- a third PMOS transistor having one end coupled to the first node, an other end coupled to an sixth node coupled to the fourth circuit and to which the control signal is applied, and a gate coupled to the fifth node;
- a third NMOS transistor having one end coupled to the sixth node, an other end coupled to the fourth node, and a gate into which the reset signal is input; and
- a first capacitor element having one electrode coupled to the sixth node and an other electrode coupled to the fourth node.

11. The device according to claim 10, wherein
in the first state, the sixth node is maintained at a voltage of the first logic level by an RC delay circuit that includes the third PMOS transistor and the capacitor element.

12. The device according to claim 10, wherein
in the second state, a voltage of the first logic level is applied to the fifth node when the second NMOS transistor is set to an on state, and a voltage of the second logic level is applied to the sixth node when the third PMOS transistor is set to the on state.

13. The device according to claim 10, wherein
in the third state, the second NMOS transistor is set to an off state, a third voltage based on the current source is applied to the fifth node, and a voltage of the second logic level is applied to the sixth node when the third PMOS transistor is set to an on state.

14. The device according to claim 3, wherein
the logic circuit includes:
- a NAND circuit in which a first input terminal is coupled to a seventh node, and the input signal is input to a second input terminal;
- an inverter circuit in which an input terminal is coupled to an output terminal of the NAND circuit, and an output terminal is coupled to an output terminal of the output signal;
- a second resistor element having one end coupled to a first node to which the power-supply voltage is applied and an other end coupled to the seventh node;
- a fourth NMOS transistor having one end coupled to the seventh node, an other end coupled to an fourth node to which the ground voltage is applied, and a gate into which the reset signal is input; and
- a second capacitor element having one electrode coupled to the seventh node and an other electrode coupled to the fourth node.

15. The device according to claim 14, wherein
in the second state, the NAND circuit is applied a voltage of the first logic level to the first input terminal, and outputs a voltage of the second logic level.

16. The device according to claim 14, wherein
in the third state, the NAND circuit is applied a voltage of the second logic level to the first input terminal, and outputs an inversion signal of the input signal.

17. The device according to claim 3, wherein
the first circuit includes:
- a third resistor element having one end coupled to a first node to which the power-supply voltage is applied and an other end coupled to an eighth node,
- a fourth resistor element having one end coupled to the first node and an other end coupled to a ninth node;
- a fifth NMOS transistor having one end and a gate coupled to the first node, and an other end coupled to a fourth node to which the ground voltage is applied;
- a sixth NMOS transistor having one end coupled to the ninth node, an other end coupled to the fourth node, and a gate coupled to the eighth node; and
- a third capacitor element having one electrode coupled to the eighth node and an other electrode coupled to the fourth node.

18. The device according to claim 3, wherein
the first logic level is a "Low" level, and
the second logic level is a "High" level.

* * * * *